(12) United States Patent
Kong et al.

(10) Patent No.: US 10,553,814 B2
(45) Date of Patent: Feb. 4, 2020

(54) ARRAY SUBSTRATE, DISPLAY PANEL, DISPLAY DEVICE, METHOD FOR MANUFACTURING ARRAY SUBSTRATE AND METHOD FOR MANUFACTURING DISPLAY PANEL

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yi Kong, Beijing (CN); Junhao Liu, Beijing (CN); Hongwei Xue, Beijing (CN); Qingsong Xu, Beijing (CN); Lu Liu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/525,500

(22) PCT Filed: Dec. 17, 2015

(86) PCT No.: PCT/CN2015/097696
§ 371 (c)(1),
(2) Date: May 9, 2017

(87) PCT Pub. No.: WO2017/031874
PCT Pub. Date: Mar. 2, 2017

(65) Prior Publication Data
US 2018/0159066 A1 Jun. 7, 2018

(30) Foreign Application Priority Data

Aug. 26, 2015 (CN) .......................... 2015 1 0531483

(51) Int. Cl.
*G02F 1/1339* (2006.01)
*H01L 51/52* (2006.01)
(Continued)

(52) U.S. Cl.
CPC .......... *H01L 51/524* (2013.01); *H01L 21/475* (2013.01); *H01L 21/70* (2013.01); *H01L 27/12* (2013.01)

(58) Field of Classification Search
CPC ............. G02F 1/1339; G02F 1/133345; H01L 51/524; H01L 51/5246; H01L 51/525
See application file for complete search history.

(56) References Cited

U.S. PATENT DOCUMENTS

| 7,532,263 B2 * | 5/2009 | Lee ................... G02F 1/136213 |
| | | 257/59 |
| 2004/0150776 A1 * | 8/2004 | Kim ...................... G02F 1/1339 |
| | | 349/138 |

(Continued)

FOREIGN PATENT DOCUMENTS

| CN | 1952762 A | 4/2007 |
| CN | 101106142 A | 1/2008 |

(Continued)

OTHER PUBLICATIONS

Second Office Action for Chinese Application No. 201510531483.2, dated Mar. 29, 2018, 7 Pages.

(Continued)

*Primary Examiner* — Bradley Smith
*Assistant Examiner* — David J Goodwin
(74) *Attorney, Agent, or Firm* — Brooks Kushman P.C.

(57) ABSTRACT

An array substrate, a display panel, a display device, a method for manufacturing the array substrate and a method for manufacturing the display panel are provided. The array substrate includes a base substrate, and an organic layer and (Continued)

a passivation layer arranged above the base substrate. The base substrate includes a display region and a non-display region surrounding the display region. Each of the organic layer and the passivation layer is arranged in both the display region and the non-display region. A groove is arranged in the organic layer and the passivation layer in the non-display region, the groove penetrates the organic layer and the passivation layer and is of a closed pattern surrounding the display region. The groove is to be filled with a sealing material.

20 Claims, 3 Drawing Sheets

(51) Int. Cl.
*H01L 27/12* (2006.01)
*H01L 21/70* (2006.01)
*H01L 21/475* (2006.01)

(56) References Cited

U.S. PATENT DOCUMENTS

| | | | |
|---|---|---|---|
| 2005/0184927 A1 | 8/2005 | Kwak | |
| 2006/0057334 A1* | 3/2006 | Chen | H01L 51/5246 428/139 |
| 2006/0267492 A1 | 11/2006 | Oh | |
| 2007/0085965 A1 | 4/2007 | Manabe | |
| 2011/0194062 A1* | 8/2011 | Lee | G02F 1/1339 349/149 |
| 2012/0146041 A1 | 6/2012 | Han et al. | |
| 2014/0176895 A1* | 6/2014 | Park | G02F 1/1339 349/153 |
| 2015/0001501 A1 | 1/2015 | Cho et al. | |
| 2015/0092143 A1* | 4/2015 | Cha | G02F 1/1341 349/106 |
| 2015/0131041 A1* | 5/2015 | Moriwaki | G02F 1/1337 349/106 |
| 2015/0301370 A1* | 10/2015 | Moriwaki | G02F 1/1339 349/42 |
| 2017/0017109 A1* | 1/2017 | Park | G02F 1/133512 |

FOREIGN PATENT DOCUMENTS

| | | |
|---|---|---|
| CN | 104253241 A | 12/2014 |
| JP | 2005093134 A | 4/2005 |
| JP | 2008147073 A | 6/2008 |

OTHER PUBLICATIONS

First Office Action for Chinese Application No. 201510531483.2, dated Aug. 18, 2017, 8 Pages.
International Search Report and Written Opinion for Application No. PCT/CN2015/097696, dated May 10, 2016, 8 Pages.

* cited by examiner

ARRAY SUBSTRATE, DISPLAY PANEL, DISPLAY DEVICE, METHOD FOR MANUFACTURING ARRAY SUBSTRATE AND METHOD FOR MANUFACTURING DISPLAY PANEL

CROSS REFERENCE OF RELATED APPLICATIONS

This application is the U.S. national phase of PCT Application No. PCT/CN2015/097696 filed on Dec. 17, 2015, which claims priority to Chinese Patent Application No. 201510531483.2 filed on Aug. 26, 2015, the disclosures of which are incorporated in their entirety by reference herein.

TECHNICAL FIELD

The present disclosure relates to the field of display technology, in particular to an array substrate, a display panel, a display device, a method for manufacturing the array substrate and a method for manufacturing the display panel.

BACKGROUND

In related art, it may be necessary to arrange an organic layer in an array substrate, and a capacitance may be reduced due to a large thickness of the organic layer. For example, the organic layer may be arranged between a source-drain metal layer and a transparent conductive layer, so as to reduce a capacitance between the source-drain metal layer and the transparent conductive layer. After the array substrate with the above structure and an opposite substrate are aligned to form a display panel, a pressure cooker test (PCT) is usually carried out at a temperature of 120° C., a humidity of 100% and 2 atmospheres. As a result, the organic layer may generate cracks during the PCT because the organic layer may expand under high temperature, and thus a passivation layer arranged above the organic layer may also generate cracks due to a force caused by expansion of the organic layer. As a result, moisture generated during the PCT may enter a display region of the display panel through the cracks, such that bubbles are generated and a display quality is adversely affected.

SUMMARY

In view of the above, the present disclosure provides an array substrate, a display panel, a display device, a method for manufacturing the array substrate and a method for manufacturing the display panel, so as to prevent the moisture from entering the display region of the display panel even if the display panel including the organic layer generate cracks during the PCT.

The present disclosure provides an array substrate including: a base substrate; and an organic layer and a passivation layer arranged above the base substrate. The base substrate includes a display region and a non-display region surrounding the display region, each of the organic layer and the passivation layer is arranged in both the display region and the non-display region, a groove is arranged in the organic layer and the passivation layer in the non-display region, the groove penetrates the organic layer and the passivation layer and is of a closed pattern surrounding the display region, and the groove is to be filled with a sealing material.

Optionally, the non-display region includes a sealant arrangement region surrounding the display region, and the groove is arranged in the sealant arrangement region.

Optionally, the array substrate further includes a source-drain metal layer and a first transparent conductive layer arranged above the base substrate. The first transparent conductive layer includes a portion arranged in the display region and a portion arranged in the non-display region, and in the display region, the organic layer is arranged between the source-drain metal layer and the first transparent conductive layer.

Optionally, the source-drain metal layer includes a source-drain metal lead arranged in the non-display region, where an orthogonal projection of the source-drain metal lead onto the base substrate at least partially overlaps an orthogonal projection of a bottom of the groove onto the base substrate. The array substrate further includes an antioxidation layer arranged in the groove and covering at least the bottom of the groove.

Optionally, the array substrate further includes a second transparent conductive layer arranged on the passivation layer, where the antioxidation layer is the portion of the first transparent conductive layer arranged in the non-display region.

Optionally, the arrange substrate may further include the sealing material filled in the groove.

The present disclosure further provides a display panel including the above array substrate and an opposite substrate.

Optionally, the non-display region includes a sealant arrangement region surrounding the display region and the groove is arranged in the sealant arrangement region. The display panel further includes a sealant and the groove is filled up with a portion of the sealant.

The present disclosure further provides a display device including the above display panel.

The present disclosure further provides a method for manufacturing an array substrate, including steps of: providing a base substrate including a display region and a non-display region surrounding the display region; forming an organic layer in both the display region and the non-display region, forming a passivation layer in both the display region and the non-display region, and forming a groove in the organic layer and the passivation layer in the non-display region, where the groove penetrates the organic layer and the passivation layer and is of a closed pattern surrounding the display region, and the groove is to be filled with a sealing material.

Optionally, the step of forming the organic layer includes: forming an organic material film; coating the organic material film with a photoresist; exposing and developing the photoresist with a mask, to form a first photoresist reserved region and a first photoresist removed region including a region corresponding to the groove; etching the organic material film in the first photoresist removed region to form a pattern of the organic layer; and peeling off the remaining photoresist.

Optionally, the step of forming the passivation layer includes: forming a passivation material film; coating the passivation material film with a photoresist; exposing and developing the photoresist on the passivation material film with a mask, to form a second photoresist reserved region and a second photoresist removed region including the region corresponding to the groove; etching the passivation material film in the second photoresist removed region to form a pattern of the passivation layer; and peeling off the remaining photoresist.

The present disclosure further provides a method for manufacturing a display panel including steps of: forming the array substrate with the above method, and forming an opposite substrate.

Optionally, the non-display region includes a sealant arrangement region surrounding the display region, and the groove is arranged in the sealant arrangement region. The method further includes: smearing a sealant on the array substrate in the sealant arrangement region or smearing the sealant on the opposite substrate in a region corresponding to the sealant arrangement region; aligning the array substrate and the opposite substrate to form a cell, and filling the groove with the sealant.

The groove penetrating the organic layer and the passivation layer is formed in the non-display region of the array substrate. The groove is of the enclosed pattern surrounding the display region. After the sealing material is filled in the groove, the sealing material may insolate the organic layer and the passivation layer in the display region from the organic layer and the passivation layer in the non-display region. During the subsequent PCT, even if the organic layer and/or the passivation layer generate cracks, the moisture is prevented from entering the display region by the sealing material filled in the groove.

DETAILED DESCRIPTION

Figure 1:
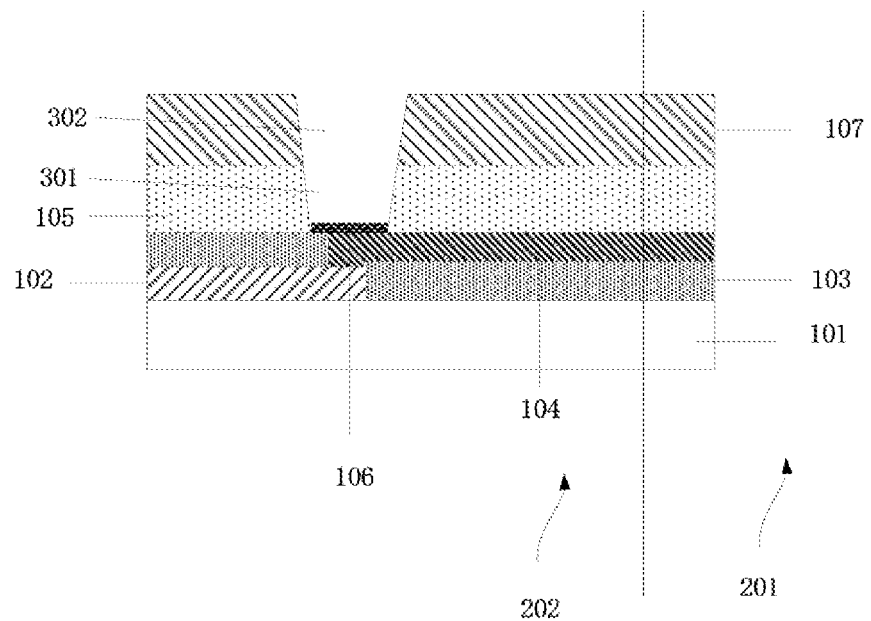
FIG. 1 is a schematic structural view of an array substrate according to some embodiments of the present disclosure.

The present disclosure provides an array substrate including: a base substrate, and an organic layer and a passivation layer arranged above the base substrate, where the base substrate includes a display region and a non-display region surrounding the display region, each of the organic layer and the passivation layer is arranged in both the display region and the non-display region, a groove is arranged in the organic layer and the passivation layer in the non-display region, the groove penetrates the organic layer and the passivation layer and is of a closed pattern surrounding the display region, and the groove is to be filled with a sealing material.

Due to the fact that the groove penetrates the organic layer and the passivation layer in the non-display region of the array substrate, and is of the enclosed pattern surrounding the display region, the sealing material may insolate the organic layer and the passivation layer in the display region from the organic layer and the passivation layer in the non-display region after the sealing material is filled in the groove. During a subsequent PCT, even if the organic layer and/or the passivation layer generate cracks, the moisture is prevented from entering the display region by the sealing material filled in the groove.

In some embodiments of the present disclosure, the array substrate may further include the sealing material filled in the groove. The sealing material may be a sealant or the like.

In some other embodiments of the present disclosure, the groove may be filled with a sealant for sealing the array substrate and the opposite substrate. In this case, the non-display region includes a sealant arrangement region surrounding the display region, and the groove is arranged in the sealant arrangement region. As a result, in the case that the array substrate and the opposite substrate are aligned to form a cell, the sealant may be filled in the groove.

In some embodiments of the present disclosure, the array substrate may further includes: a source-drain metal layer and a first transparent conductive layer arranged above the base substrate, where the organic layer is arranged between the source-drain metal layer and the first transparent conductive layer, so as to reduce a capacitance between the source-drain metal layer and the first transparent conductive layer. In some embodiments, the array substrate includes a pixel electrode and does not include a common electrode. In this case, the first transparent conductive layer is a layer at which the pixel electrode is arranged. In some other embodiments, the array substrate may include both the pixel electrode and the common electrode, i.e., the array substrate includes two transparent conductive layers; here, the first transparent conductive layer may be the layer at which the pixel electrode is arranged, or a layer at which the common electrode is arranged.

In the embodiments of the present disclosure, the source-drain metal layer may include a data line in the display region and a source-drain metal lead in the non-display region. The source-drain metal lead is connected to a data line, and configured to transmit a signal for the data line. In some embodiments, an orthogonal projection of the source-drain metal lead onto the base substrate at least partially overlaps an orthogonal projection of a bottom of the groove onto the base substrate, i.e., a portion of the source-drain metal lead may be located at the bottom of the groove, such that it may be oxidized. Optionally, in the embodiments of the present disclosure, the array substrate may further include an antioxidation layer arranged in the groove and covering at least the bottom of the groove, so as to prevent the portion of the source-drain metal lead that is located at the bottom of the groove from being oxidized. The antioxidation layer may be made of any one of various materials, such as indium tin oxide (ITO).

Figure 4:
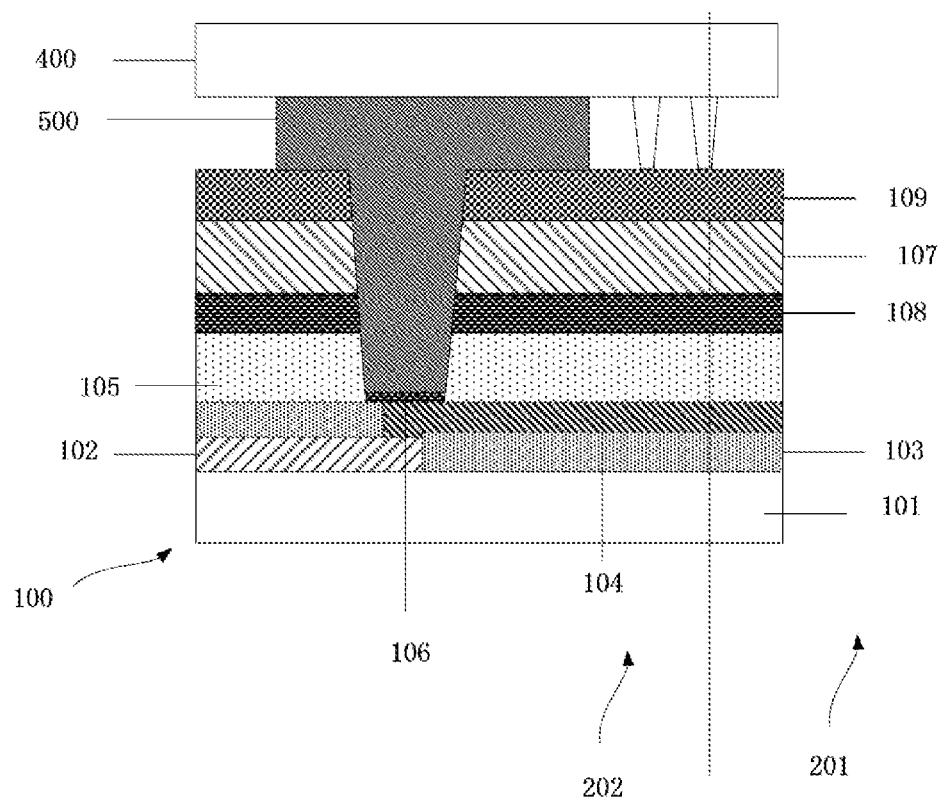
FIG. 4 is a schematic diagram of a display panel according to some embodiments of the present disclosure.

In the embodiments where the array substrate includes two transparent conductive layers, in addition to the first transparent conductive layer, the array substrate further includes a second transparent conductive layer arranged on the passivation layer, where the second transparent conductive layer 109 is shown in FIG. 4. Optionally, the antioxidation layer and the first transparent conductive layer may be located at an identical layer, made of an identical material, and formed in one patterning process, so as to reduce the cost.

The present disclosure further provides in some embodiments a display panel including the array substrate in any one of the above embodiments and an opposite substrate.

Optionally, the base substrate of the array substrate includes the display region and the non-display region surrounding the display region. The non-display region includes a sealant arrangement region surrounding the display region, and the groove is arranged in the sealant arrangement region. The display panel further includes a sealant, where the groove is filled up with a portion of the sealant. The sealant is used to seal the array substrate and the opposite substrate to form the cell.

The present disclosure further provides a display device including the above display panel.

The present disclosure will be specifically described hereinafter in conjunction with the drawings and embodiments. The following embodiments are for illustrative purposes, but shall not be used to limit the scope of the present disclosure.

FIG. 1 is a schematic structural view of an array substrate according to some embodiments of the present disclosure. As shown in FIG. 1, the array substrate includes a base substrate 101, a gate metal layer, a gate insulation layer 103, a source-drain metal layer, an organic layer 105, a first transparent conductive layer and a passivation layer 107. As shown in FIG. 4, the first transparent conductive layer 108 is between the organic layer 105 and the passivation layer 107

The base substrate 101 includes a display region 201 and a non-display region 202 surrounding the display region 201. FIG. 1 shows merely a portion of the display region 201 and the non-display region 202.

The gate metal layer is arranged on the base substrate, and includes a gate electrode (not shown) and a gate line (not shown) in the display region 201, and a gate metal lead 102 in the non-display region 202.

The gate insulation layer 103 includes a portion in the display region 201 and a portion in the non-display region 202. The portion of the gate insulation layer 103 in the display region 201 is arranged on the gate metal layer. The portion of the gate insulation layer 103 in the non-display region is provided with a via hole penetrating the gate insulation layer 103. A side of the gate metal lead 102 is arranged in the via hole. In the non-display region 202, the gate insulation layer 103 at a side of the via hole that is further away from the display region 201 than the other side of the via hole is arranged on the gate metal lead 102, and gate insulation layer 103 at the other side of the via hole and the gate metal lead 102 adjoin each other and are both arranged on the base substrate 101.

The source-drain metal layer includes a source electrode (not shown), a drain electrode (not shown) and a data line (not shown) in the display region 201, and a source-drain metal lead 104 in the non-display region 202. In the display region 201, the source-drain metal layer is arranged on the gate insulation layer 103. In the non-display region 202, the source-drain metal lead 104 is arranged on the gate insulation layer 103 at the other side of the via hole that is closer to the display region 201 than the side of the via hole, and adjoins the gate insulation layer 103 at the side of the via hole. The source-drain metal lead 104 is connected to the gate metal lead 102 through the via hole in the gate insulation layer 103.

Figure 5:
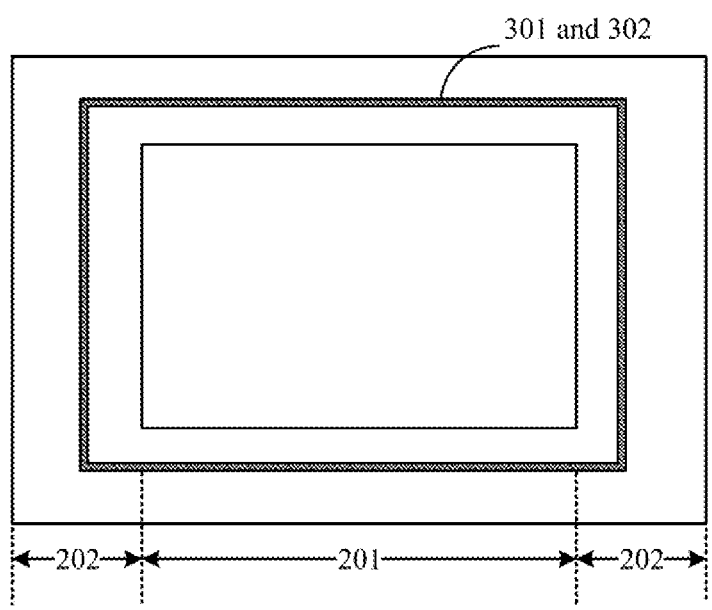
FIG. 5 is a schematic diagram of a display panel according to some embodiments of the present disclosure.

The organic layer 105 is arranged in both the display region 201 and the non-display region 202. The organic layer 105 in the display region 201 is arranged on the source-drain metal layer. The organic layer 105 in the non-display region 202 is arranged on the source-drain metal lead 104 and the gate insulation layer 103 at the side of the via hole that is farther away from the display region 201 than the other side of the via hole. A first sub-groove 301 penetrating the organic layer 105 is arranged in the organic layer 105 in the non-display region 202. The first sub-groove 301 is of an enclosed pattern surrounding the display region 201 (as shown in FIG. 5). An orthogonal projection of the source-drain metal lead 104 onto the base substrate at least partially overlaps an orthogonal projection of a bottom of a groove onto the base substrate, i.e., a portion of the source-drain metal lead 104 is located at a bottom of the first sub-groove 301.

The first transparent conductive layer includes a first electrode (not shown) in the display region and an antioxidation layer 106 in the non-display region 202. In the display region 201, the first transparent conductive layer is arranged on the organic layer 105. In the non-display region 202, the antioxidation layer 106 is arranged in the first sub-groove 301 and covers the bottom of the first sub-groove 301, so as to prevent the source-drain metal lead 104 that is located at the bottom of the first sub-groove 301 from being oxidized.

The passivation layer 107 is arranged in both the display region 201 and the non-display region 202. The passivation layer 107 in the display region 201 is arranged on the first transparent conductive layer. A second sub-groove 302 penetrating the passivation layer 107 is arranged in the passivation layer 107 in the non-display region 202. The second sub-groove 302 is of an enclosed pattern surrounding the display region (as shown in FIG. 5), arranged at a position corresponding to a position of the first sub-groove 301 and in communication with the first sub-groove 301, so as to form a groove which penetrates the organic layer 105 and the passivation layer 107. The groove penetrating the organic layer 105 and the passivation layer 107 is to be filled with a sealing material.

Figure 2:
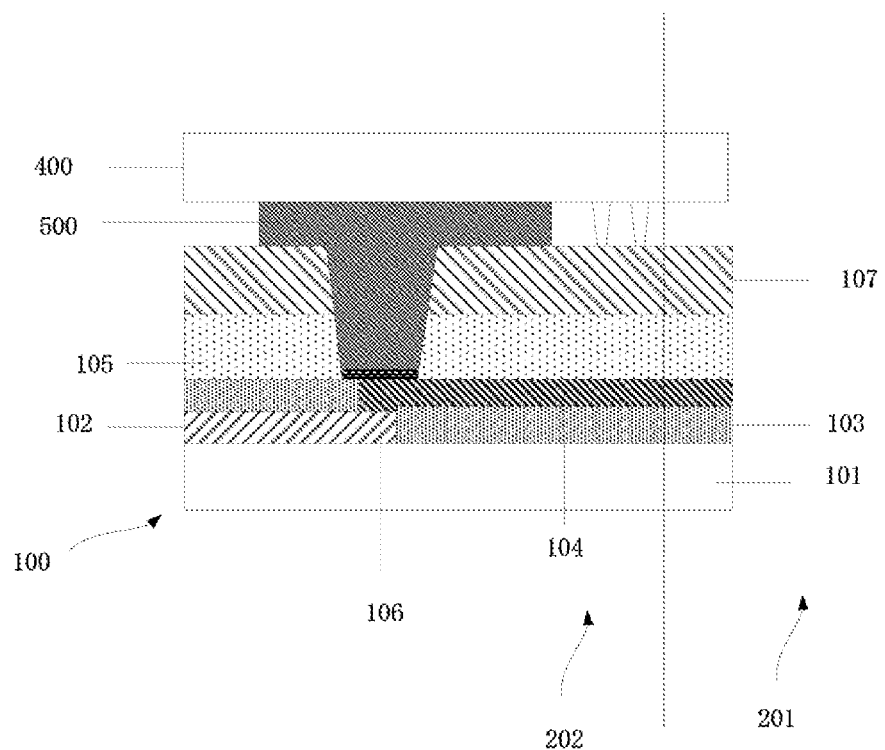
FIG. 2 is a schematic structural view of a display panel according to some embodiments of the present disclosure.

FIG. 2 is a schematic structural view of a display panel according to some embodiments of the present disclosure. As shown in FIG. 2, the display panel includes the array substrate 100 as shown in FIG. 1 and an opposite substrate 400.

The non-display region 202 of the base substrate in the array substrate includes a sealant arrangement region surrounding the display region 201. The groove penetrating the organic layer 105 and the passivation layer 107 is arranged in the sealant arrangement region.

The display panel further includes a sealant 500. The groove is filled up with a portion of the sealant 500. The sealant 500 is used to seal the array substrate 100 and the opposite substrate 400 to form a cell.

Figure 3:
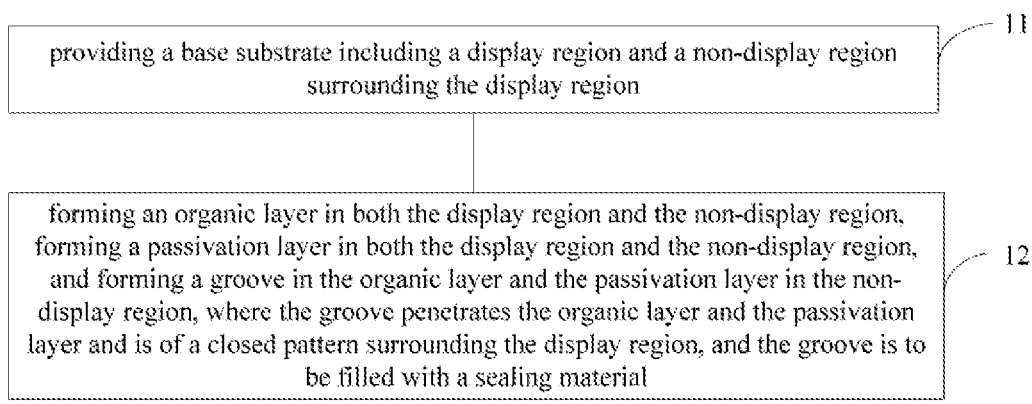
FIG. 3 is a flow chart of a method for manufacturing an array substrate according to some embodiments of the present disclosure.

The present disclosure further provides a method for manufacturing an array substrate. As shown in FIG. 3, the method includes:

step 11: providing a base substrate including a display region and a non-display region surrounding the display region;

step 12: forming an organic layer in both the display region and the non-display region, forming a passivation layer in both the display region and the non-display region, and forming a groove in the organic layer and the passivation layer in the non-display region, where the groove penetrates the organic layer and the passivation layer and is of a closed pattern surrounding the display region, and the groove is to be filled with a sealing material.

Optionally, the step of forming the organic layer includes:

step 121: forming an organic material film;

step 122: coating the organic material film with a photoresist;

step 123: exposing and developing the photoresist with a mask, to form a first photoresist reserved region and a first photoresist removed region including a region corresponding to the groove;

step 124: etching the organic material film in the first photoresist removed region to form a pattern of the organic layer;

step 125: peeling off the remaining photoresist.

Optionally, the step of forming the passivation layer includes:

step 126: forming a passivation material film;

step 127: coating the passivation material film with a photoresist;

step 128: exposing and developing the photoresist on the passivation material film with a mask, to form a second photoresist reserved region and a second photoresist removed region including the region corresponding to the groove;

step 129: etching the passivation material film in the second photoresist removed region to form a pattern of the passivation layer;

step 130: peeling off the remaining photoresist.

The present disclosure further provides a method for manufacturing a display panel including: forming an array substrate with the method in any one of the above embodiments, and forming an opposite substrate.

Optionally, the non-display region includes a sealant arrangement region surrounding the display region, and the groove is arranged in the sealant arrangement region. The method for manufacturing the display panel further includes: smearing a sealant on the array substrate in the sealant arrangement region or smearing the sealant on the opposite substrate in a region corresponding to the sealant arrangement region; aligning the array substrate and the opposite substrate to form a cell, and then filling the groove in the array substrate with the sealant.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. An array substrate, comprising:
a base substrate; and
a source-drain metal layer, an organic layer and a passivation layer arranged above the base substrate in sequence,
wherein the base substrate comprises a display region and a non-display region surrounding the display region, each of the organic layer and the passivation layer is arranged in both the display region and the non-display region, a groove is arranged in the organic layer and the passivation layer in the non-display region, and the groove penetrates the organic layer and the passivation layer and is of a closed pattern surrounding the display region,
wherein the array substrate further comprises an antioxidation layer arranged in the groove and covering at least the bottom of the groove, the groove is filled with a sealing material, and the antioxidation layer directly touches both the source-drain metal layer and the sealing material in the groove, and
the source-drain metal layer comprises a source-drain metal lead arranged in the non-display region, wherein an orthogonal projection of the source-drain metal lead onto the base substrate at least partially overlaps an orthogonal projection of a bottom of the groove onto the base substrate.

2. The array substrate according to claim 1, wherein the non-display region comprises a sealant arrangement region surrounding the display region, and the groove is arranged in the sealant arrangement region.

3. The array substrate according to claim 1, further comprising a first transparent conductive layer arranged above the base substrate,
wherein the first transparent conductive layer comprises a portion arranged in the display region and a portion arranged in the non-display region, and in the display region, the organic layer is arranged between the source-drain metal layer and the first transparent conductive layer.

4. The array substrate according to claim 3, further comprising a second transparent conductive layer arranged on the passivation layer,
wherein the antioxidation layer is the portion of the first transparent conductive layer arranged in the non-display region.

5. A display panel, comprising the array substrate according to claim 1 and an opposite substrate,
wherein the non-display region comprises a sealant arrangement region surrounding the display region and the groove is arranged in the sealant arrangement region.

6. A display device, comprising the display panel according to claim 5.

7. The display panel according to claim 5, wherein the array substrate further comprises a first transparent conductive layer arranged above the base substrate
wherein the first transparent conductive layer comprises a portion arranged in the display region and a portion arranged in the non-display region, and in the display region, the organic layer is arranged between the source-drain metal layer and the first transparent conductive layer.

8. The array substrate according to claim 1, further comprising a first transparent conductive layer and a second transparent conductive layer that are stacked on the organic layer in sequence, wherein the passivation layer is arranged between the first transparent conductive layer and the second transparent conductive layer.

9. The array substrate according to claim 8, wherein the second transparent conductive layer is arranged above the first transparent conductive layer, and an orthogonal projection of the second transparent conductive layer at least partially overlaps an orthogonal projection of the first transparent conductive layer,
wherein the antioxidation layer is made of indium tin oxide.

10. A method for manufacturing an array substrate, comprising steps of:
providing a base substrate comprising a display region and a non-display region surrounding the display region;
forming a source-drain metal layer on the base substrate;
forming an organic layer in both the display region and the non-display region, forming a passivation layer in both the display region and the non-display region, and forming a groove in the organic layer and the passivation layer in the non-display region, wherein the groove penetrates the organic layer and the passivation layer and is of a closed pattern surrounding the display region,
wherein the array substrate further comprises an antioxidation layer arranged in the groove and covering at least the bottom of the groove, the groove is filled with a sealing material, and the antioxidation layer directly touches both the source-drain metal layer and the sealing material in the groove, and
the source-drain metal layer comprises a source-drain metal lead arranged in the non-display region, wherein an orthogonal projection of the source-drain metal lead onto the base substrate at least partially overlaps an orthogonal projection of a bottom of the groove onto the base substrate.

11. The method according to claim 10, wherein the step of forming the organic layer comprises:
- forming an organic material film;
- coating the organic material film with a photoresist;
- exposing and developing the photoresist with a mask, to form a first photoresist reserved region and a first photoresist removed region comprising a region corresponding to the groove;
- etching the organic material film in the first photoresist removed region to form a pattern of the organic layer; and
- peeling off the remaining photoresist.

12. The method according to claim 11, wherein the step of forming the passivation layer comprises:
- forming a passivation material film;
- coating the passivation material film with a photoresist;
- exposing and developing the photoresist on the passivation material film with a mask, to form a second photoresist reserved region and a second photoresist removed region comprising the region corresponding to the groove;
- etching the passivation material film in the second photoresist removed region to form a pattern of the passivation layer; and
- peeling off the remaining photoresist.

13. A method for manufacturing a display panel, comprising steps of: forming an array substrate with the method according to claim 10, and forming an opposite substrate.

14. The method according to claim 13, wherein the non-display region comprises a sealant arrangement region surrounding the display region, the groove is arranged in the sealant arrangement region, and the sealing material comprises a sealant,
the method further comprises:
- smearing the sealant on the array substrate in the sealant arrangement region or smearing the sealant on the opposite substrate in a region corresponding to the sealant arrangement region; and
- aligning the array substrate and the opposite substrate to form a cell, and filling the groove with the sealant.

15. An array substrate, comprising:
- a base substrate; and
- a source-drain metal layer, an organic layer and a passivation layer arranged above the base substrate in sequence,
- wherein the base substrate comprises a display region and a non-display region surrounding the display region, each of the organic layer and the passivation layer is arranged in both the display region and the non-display region, a groove is arranged in the organic layer and the passivation layer in the non-display region, and the groove penetrates the organic layer and the passivation layer, and
- wherein the array substrate further comprises an antioxidation layer arranged in the groove and covering at least the bottom of the groove, the groove is filled with a sealing material, and the antioxidation layer directly touches both the source-drain metal layer and the sealing material in the groove, and
- the source-drain metal layer comprises a source-drain metal lead arranged in the non-display region, wherein an orthogonal projection of the source-drain metal lead onto the base substrate at least partially overlaps an orthogonal projection of a bottom of the groove onto the base substrate.

16. The array substrate according to claim 15, wherein the non-display region comprises a sealant arrangement region at the periphery of the display region, and the groove is arranged in the sealant arrangement region.

17. The array substrate according to claim 15, further comprising a first transparent conductive layer arranged above the base substrate,
- wherein the first transparent conductive layer comprises a portion arranged in the display region and a portion arranged in the non-display region, and in the display region, the organic layer is arranged between the source-drain metal layer and the first transparent conductive layer.

18. The array substrate according to claim 17, further comprising a second transparent conductive layer arranged on the passivation layer,
- wherein the antioxidation layer is the portion of the first transparent conductive layer arranged in the non-display region.

19. The array substrate according to claim 15, further comprising a first transparent conductive layer and a second transparent conductive layer that are stacked on the organic layer in sequence, wherein the passivation layer is arranged between the first transparent conductive layer and the second transparent conductive layer.

20. The array substrate according to claim 19, wherein the second transparent conductive layer is arranged above the first transparent conductive layer, and an orthogonal projection of the second transparent conductive layer at least partially overlaps an orthogonal projection of the first transparent conductive layer,
- wherein the antioxidation layer is made of indium tin oxide.

* * * * *